US008638954B2

(12) United States Patent
Aoki

(10) Patent No.: US 8,638,954 B2
(45) Date of Patent: Jan. 28, 2014

(54) AUDIO SIGNAL PROCESSING APPARATUS AND SPEAKER APPARATUS

(75) Inventor: Ryotaro Aoki, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 300 days.

(21) Appl. No.: 12/712,563

(22) Filed: Feb. 25, 2010

(65) Prior Publication Data

US 2010/0246853 A1 Sep. 30, 2010

(30) Foreign Application Priority Data

Mar. 30, 2009 (JP) ................................ 2009-082814

(51) Int. Cl.
*H03G 9/00* (2006.01)

(52) U.S. Cl.
USPC ........................................................ 381/102

(58) Field of Classification Search
USPC .......... 381/58, 59, 95, 98, 99, 61–63, 17–24, 381/104–107; 84/625, 660, 661; 700/94
See application file for complete search history.

(56) References Cited

U.S. PATENT DOCUMENTS 5,226,089 A * 7/1993 Yoon et al. ..................... 381/96
6,111,960 A * 8/2000 Aarts et al. ..................... 381/61
6,134,330 A 10/2000 De Poortere et al.
6,335,973 B1 1/2002 Case
6,606,388 B1 * 8/2003 Townsend et al. .............. 381/17
8,036,394 B1 * 10/2011 Yonemoto et al. .............. 381/61
2007/0140511 A1 6/2007 Lin et al.
2008/0175409 A1 * 7/2008 Lee et al. ........................ 381/98
2009/0016547 A1 * 1/2009 Aoki et al. .................... 381/107

FOREIGN PATENT DOCUMENTS

EP 1 947 903 A1 7/2008
JP 11-509712 A 8/1999
WO WO 97/42789 A1 11/1997
WO WO 00/14998 A1 3/2000

OTHER PUBLICATIONS

Extended European Search Report dated Aug. 3, 2012 (eight (8) pages).

* cited by examiner

*Primary Examiner* — Lun-See Lao
(74) *Attorney, Agent, or Firm* — Crowell & Moring LLP

(57) ABSTRACT

An audio signal processing apparatus includes: a first filtering unit which outputs an audio signal while attenuating frequency components except for preset frequency components; a detecting unit which detects a sound volume level; an amplitude limiting unit which calculates an amplitude limiting level corresponding to the sound volume level, and which limits a part of a waveform of the audio signal output from the first filtering unit; a second filtering unit which outputs the audio signal output from the amplitude limiting unit while attenuating frequency components except for preset frequency components including a part of the frequency band of the audio signal output from the first filtering unit, and a part of the frequency band of the harmonics; a compressing unit which compresses a dynamic range of the audio signal; and an adding unit which adds the audio signal output from the compressing unit to the input audio signal.

9 Claims, 5 Drawing Sheets

AUDIO SIGNAL PROCESSING APPARATUS AND SPEAKER APPARATUS

BACKGROUND OF THE INVENTION

1. Technical Field

The present invention relates to a technique for emphasizing bass sounds of an audio signal.

2. Background Art

In order to emphasize the low-frequency components of a sound emitted from a speaker, usually, the level of the low-frequency components is increased. Sometimes, a small-diameter speaker or the like cannot emit the low-frequency components depending on its characteristics. In such a case, a technique is employed in which harmonics of the low-frequency components are generated and added to the original sound, thereby causing the sound to be listened as if the low-frequency component is expanded, while using the phenomenon which is called Missing fundamental (see, for example, JP-T-11-509712).

According to the technique, a person can listen the sound as if the low-frequency component is expanded. However, the low-frequency component is different from the original one. Therefore, there is a case where a sense of strangeness such as a change in sound quality and distortion is caused depending on the processing method.

SUMMARY OF THE INVENTION

The invention has been conducted in view of the above-discussed circumstances. It is an object of the invention to provide an audio signal processing apparatus and a speaker apparatus in which harmonics of the low-frequency component of an audio signal are added to the audio signal, whereby, when the low-frequency component is to be expanded, the sound quality can be prevented from being lowered.

In order to achieve the object, there is provided an audio signal processing apparatus including: an acquiring unit which acquires an input audio signal; a first filtering unit which outputs the audio signal acquired by the acquiring unit while attenuating frequency components of the audio signal except for frequency components of a first preset frequency band; a detecting unit which detects a sound volume level of the audio signal output from the first filtering unit; an amplitude limiting unit which calculates an amplitude limiting level corresponding to the sound volume level detected by the detecting unit, and which limits a waveform of the audio signal output from the first filtering unit, an amplitude of the limited waveform being equal to or higher than the amplitude limiting level, thereby outputting an audio signal to which harmonics are added; a second filtering unit which outputs the audio signal output from the amplitude limiting unit while attenuating frequency components of the audio signal except for frequency components of a second preset frequency band including at least a part of the frequency band of the audio signal output from the first filtering unit, and a part of the frequency band of the harmonics; a compressing unit which outputs the audio signal output from the second filtering unit while compressing a dynamic range of the audio signal; and an adding unit which adds the audio signal output from the compressing unit to the input audio signal, and which outputs a result of the addition.

In the audio signal processing apparatus, the first preset frequency band in the first filtering unit may include the second preset frequency band in the second filtering unit.

In the audio signal processing apparatus, the first preset frequency band may be the same as the second preset frequency band.

In the audio signal processing apparatus, the first and second preset frequency bands may correspond to a range of 80 to 200 Hz.

In the audio signal processing apparatus, the amplitude limiting level may be set to a range of (75±10)% with respect to the sound volume level detected by the detecting unit.

The present invention also provides a speaker apparatus including: the above audio signal processing apparatus; and a speaker which emits the audio signal output from the adding unit, and wherein a lower limit frequency of the second preset frequency band in the second filtering unit is equal to or higher than a minimum resonance frequency of the speaker.

According to the present invention, it is possible to provide an audio signal processing apparatus and a speaker apparatus in which harmonics of the low-frequency component of an audio signal are added to the audio signal, whereby, when the low-frequency component is to be expanded, the sound quality can be prevented from being lowered.

DETAILED DESCRIPTION OF THE EXEMPLARY EMBODIMENTS

Hereinafter, an embodiment of the invention will be described.

<Embodiment>

Figure 1:
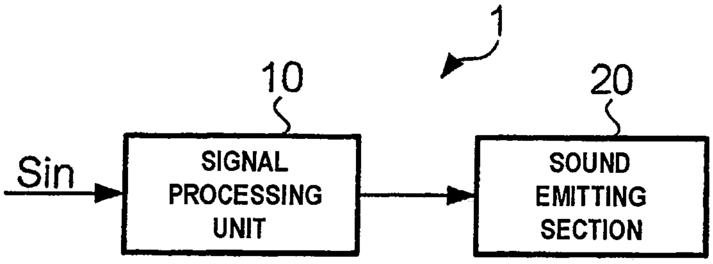
FIG. 1 is a block diagram showing the configuration of a speaker apparatus of an embodiment of the invention.

FIG. 1 is a block diagram showing the configuration of a speaker apparatus 1 according to an embodiment of the invention. The speaker apparatus 1 has a signal processing unit 10 and a sound emitting section 20. The signal processing unit 10 receives an audio signal Sin configured by a plurality of channels, in the example, 7.1 channels (C: center, FL: front L, FR: front R, SL: surround L, SR: surround R, SBL: surround back L, SBR: surround back R, and LFE: sub-woofer) performs a process which will be described below, on the audio signal Sin, and then outputs the signal to the sound emitting section 20.

The sound emitting section 20 has: an audio processing unit which adds a sound field to the audio signal output from the signal processing unit 10, and which performs an amplifying process and the like on the audio signal; and a speaker which emits the audio signal that is processed by the audio processing unit. The speaker may be disposed correspondingly for each of the channels, or configured as a speaker array unit or the like to output sounds based on the audio signal as beams in different directions respectively corresponding to the channels, so that the sounds are caused to reach the listener by using wall reflection or the like. Hereinafter, the configuration of the signal processing unit 10 will be described.

Figure 2:
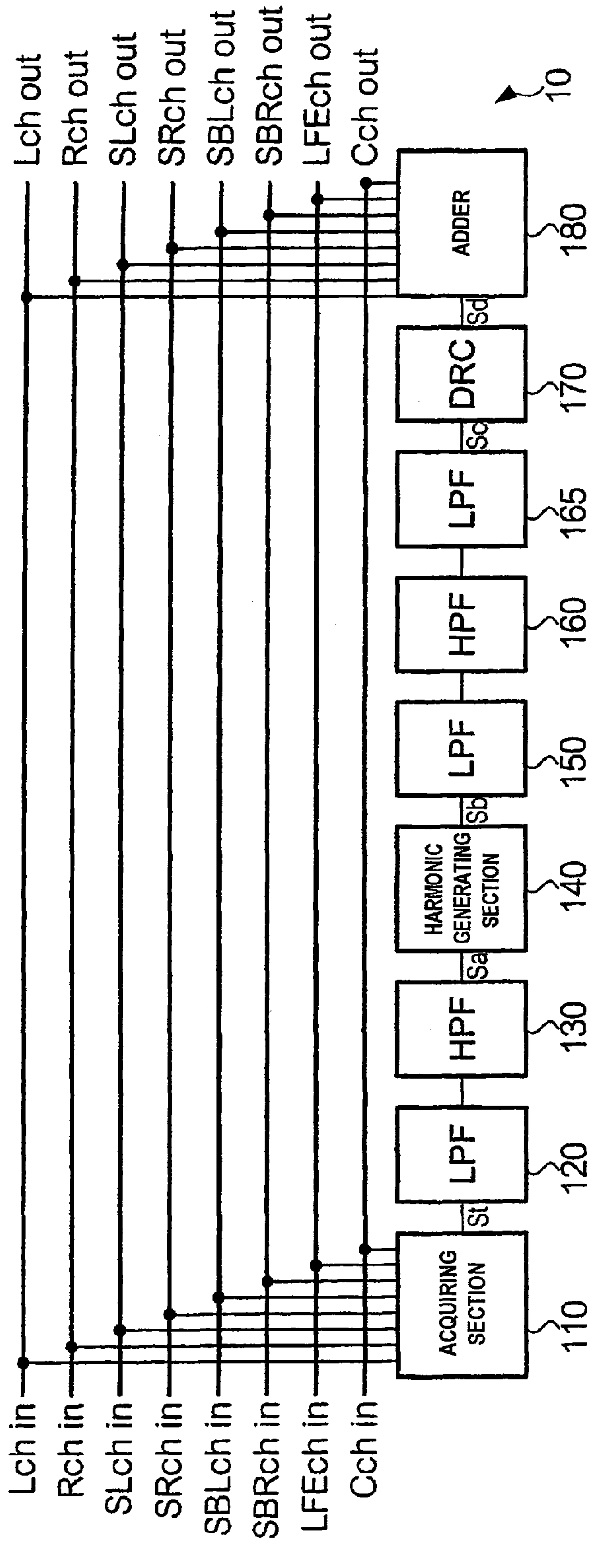
FIG. 2 is a block diagram showing the configuration of a signal processing unit in the embodiment of the invention.

FIG. 2 is a block diagram showing the configuration of the signal processing unit 10. In FIG. 2, "Lch in" and the like written in the left side indicate audio signal inputs of the channels, and "Lch out" and the like written in the right side indicate audio signal outputs of the channels which are to be supplied to the sound emitting section 20.

An acquiring section 110 acquires the audio signals of the channels, and outputs an audio signal St in which the acquired audio signals are added to one another. In this case, the acquiring section 110 may acquire audio signals of a preset part of channels. The addition may be performed while weighting each of the channels. For example, with respect to an audio signal of a specific channel, the addition may be performed while the sound volume level is doubled. The added audio signal may be normalized by, for example, dividing the signal by the number of the added channels, or calculating a weighted average. These settings may be performed by inputting through an operating unit or the like which is not shown, or by instruction from an external apparatus.

An LPF 120 is a low-pass filter which outputs the audio signal St output from the acquiring section 110 while attenuating components of a frequency band that is equal to or higher than a preset cutoff frequency. The LPF 120 includes, for example, a 2nd-IIR (Infinite Impulse Response) filter. In the example, the cutoff frequency is 200 Hz, and the attenuation gradient is 12 dB/oct.

An HPF 130 is a high-pass filter which, with respect to the audio signal output from the LPF 120, attenuates components of a frequency band that is equal to or lower than a preset cutoff frequency. The HPF 130 includes, for example, a 2nd-IIR filter. In the example, the cutoff frequency is 80 Hz, and the attenuation gradient is 12 dB/oct.

According to the configuration, the audio signal St output from the acquiring section 110 is filtered by the LPF 120 and the HPF 130 to be formed as an audio signal (hereinafter, referred to as an audio signal Sa) in which components except for a partial frequency band is attenuated. The partial frequency band corresponds from 80 Hz to 200 Hz. Components except for the frequency band, or those which are equal to or lower than 80 Hz and equal to higher than 200 Hz are attenuated by the attenuation gradient of 12 dB/oct. Alternatively, a band-pass filter may be used in place of the LPF 120 and the HPF 130.

A harmonic generating section 140 receives the audio signal Sa, adds harmonics to the signal, and then outputs a signal. Hereinafter, the audio signal to which the harmonics are added, and which is then output is referred to the audio signal Sb. The harmonic generating section 140 detects the sound volume level of the input audio signal Sa, calculates a preset ratio (in this example, 75%) with respect to the detected sound volume level as an amplitude limiting level, and limits the output of the audio signal Sa which is equal to or higher than the amplitude limiting level to clip the waveform, thereby adding harmonics to the signal. Hereinafter, an example of the configuration of the harmonic generating section 140 will be described with reference to FIG. 3.

Figure 3:
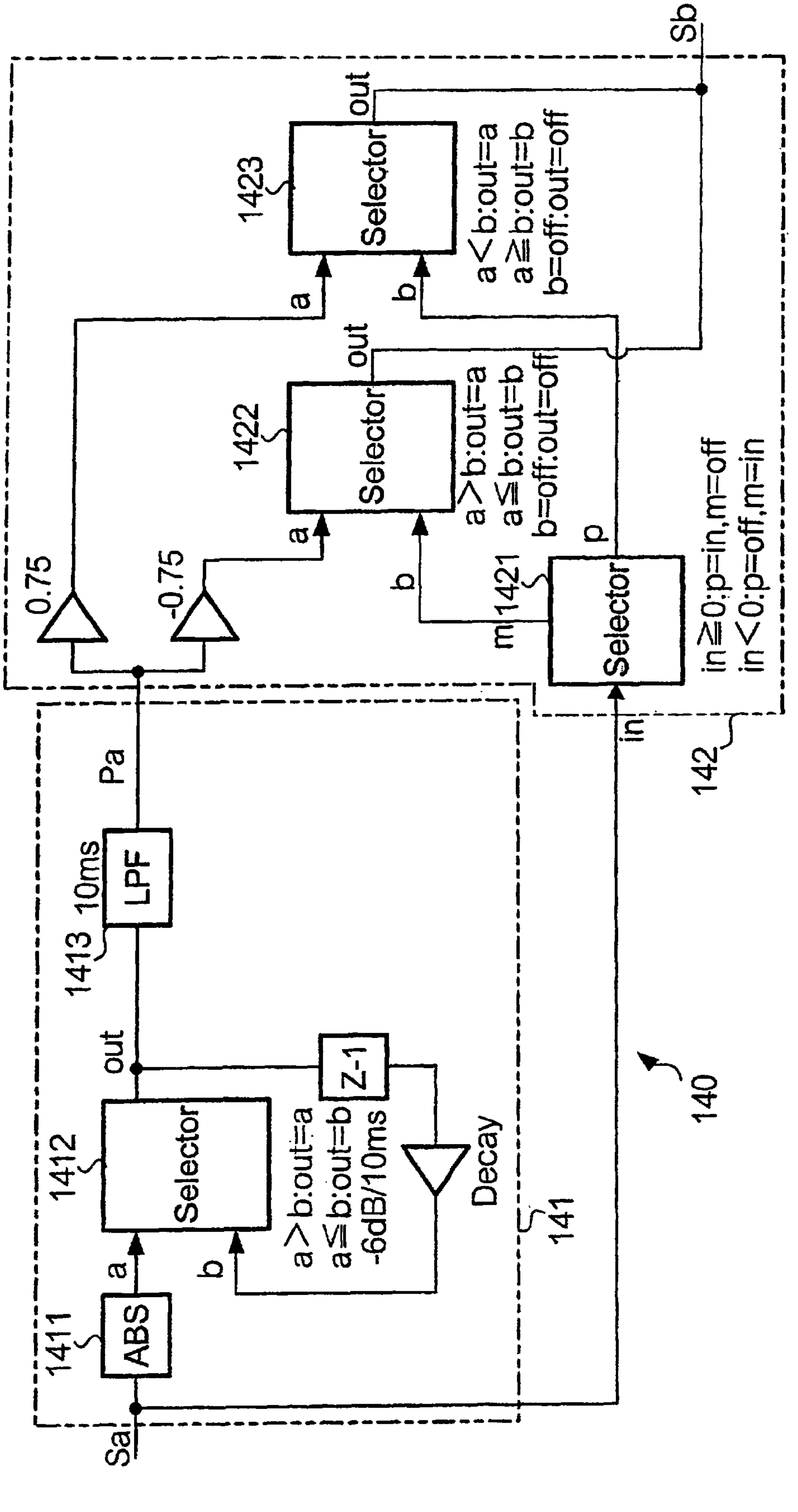
FIG. 3 is a block diagram showing the configuration of a harmonic generating section in the embodiment of the invention.

FIG. 3 is a block diagram showing the configuration of the harmonic generating section 140. The harmonic generating section 140 has a sound volume detecting section 141 and an amplitude limiting section 142. The sound volume detecting section 141 has an absolute value calculating unit (ABS) 1411, a selector (Selector) 1412, and an LPF 1413. The absolute value calculating unit 1411 calculates the absolute value of the amplitude of the input audio signal Sa, and outputs the absolute value.

The selector 1412 compares the value of the absolute signal value output from the absolute value calculating unit 1411, with a value which is output from the selector 1412 in the previous sampling, selects the larger signal, and outputs the selected signal. At this time, as illustrated, the value in the previous sampling is attenuated with a time constant by which a reduction of 6 dB per 10 ms is produced. The time constant is not restricted to this value. When the time constant is changed, the waveform of the audio signal Sb (see (b) of FIG. 4) which will be described later is changed. In accordance with the sound quality which is to be emitted from the sound emitting section 20, therefore, the time constant is adequately set.

The LPF 1413 is a low-pass filter which removes high-frequency components of the signal output from the selector 1412, and which then outputs the signal as a signal Pa in which an abrupt change is suppressed. The signal which is output in this way is a signal which indicates the sound volume level of the audio signal Sa, and which approximately corresponds to the envelop of the waveform of the audio signal Sa, and has a value which is occasionally changed in accordance with a change of the sound volume level. In the sound volume detecting section 141, the sound volume level is detected by the above-described configuration. However, the sound volume detecting section 141 is not restricted to have the configuration, and may detect a change in sound volume level in real time by any one of various known methods.

The amplitude limiting section 142 has selectors 1421, 1422, 1423. If the amplitude of the input audio signal Sa is "0" or more, the selector 1421 outputs an audio signal Sa(p) to the selector 1423, and stops the output to the selector 1422. If the amplitude of the input audio signal Sa is less than "0", the selector 1421 outputs an audio signal Sa(m) to the selector 1422, and stops the output to the selector 1423.

The selector 1422 compares the output value of the audio signal Sa(m) output from the selector 1421, with value "Pa×(−0.75)" which is obtained by multiplying the signal Pa with "−0.75" as illustrated. If the output value b is smaller than "Pa×(−0.75)", "Pa×(−0.75)" is output. If the output value b is equal to or larger than "Pa×(−0.75)", the output value b is output. If the input of the output value b is not performed, the output is stopped.

The selector 1423 compares the output value of the audio signal Sa(p) output from the selector 1421, with value "Pa×0.75" which is obtained by multiplying the signal Pa with "0.75" as illustrated. If the output value b is more than "Pa×0.75", "Pa×0.75" is output. If the output value b is equal to or less than "Pa×0.75", the output value b is output. If the input of the output value b is not performed, the output is stopped.

The amplitude limiting section 142 outputs a signal (hereinafter, referred to as the audio signal Sb) which is obtained by combining the outputs of the selectors 1422, 1423 with each other. The audio signal Sb which is output as a result of the above-described process in the harmonic generating section 140 is a clipped signal in which, in the waveform of the audio signal Sa, the output value that is equal to or more than 75% (the amplitude limiting level) of the sound volume level is limited. As a result of the clipping, harmonics are generated, and hence the audio signal is a signal obtained by adding harmonics to the audio signal Sa.

Figure 4:
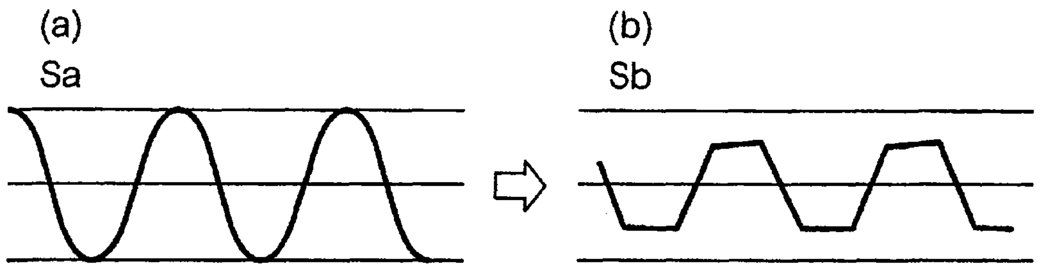
FIG. 4 shows an example of waveforms before and after a process in the harmonic generating section in the embodiment of the invention.

FIG. 4 shows an example of waveforms before and after the process in the harmonic generating section. As shown in (a) of FIG. 4, in the case where the audio signal Sa which is input to the amplitude limiting section 142 is a sinusoidal wave, the audio signal Sb which is output as a result of the process in the amplitude limiting section 142 has a waveform in which the output value that is equal to or more than 75% of the amplitude (corresponding to the sound volume level) of the audio signal Sa is limited as shown in (b) of FIG. 4. The harmonics which are generated in the above are odd-order harmonics. Actually, however, the audio signal Sa is not a simple single frequency sinusoidal wave, but contains waveforms of various frequencies in various amplitudes. Therefore, harmonics of various frequencies are added as a result of the process of the harmonic generating section 140.

As described above, the harmonic generating section 140 calculates a constant ratio of the sound volume level as the amplitude limiting level. Therefore, clipping is performed at the constant level ratio (75% of the sound volume level) irrespective of variation of the sound volume level of the audio signal Sa. By contrast, when the waveform is defined while setting the limited level as an absolute level, the level ratio to the input sound volume level is varied by the sound volume level of the audio signal Sa, and the amount of the generated harmonics is varied, so that the impression of the emitted sound changes.

In the case where the level ratio to the sound volume level is increased (for example, clipped at about 90% of the sound volume level), the amount of the generated harmonics is reduced, and the sense of expansion of the low-frequency component in the case where sounds are emitted as described later is reduced. By contrast, in the case where the level ratio to the sound volume level is reduced (for example, clipped at about 50% of the sound volume level), the amount of the generated harmonics is increased, and, even when the sense of expansion of the low-frequency component is obtained, it is often that resulting sounds are distortive and unpleasantly heard.

In the harmonic generating section 140 in the embodiment, the level ratio is "Pax0.75" or constant with respect to the sound volume level, whereby the amount of the generated harmonics is stabilized so that the audio signal Sb in which, irrespective of the sound volume level of the audio signal Sa, harmonics are added at a constant ratio to the waveform of the audio signal Sa can be output. A preferred value of the ratio to the sound volume level depends on the taste of the listener. From the viewpoint of auditory sensation, however, it is preferred that the ratio is set to a range of about 75%±10%. In order to enable the ratio to be changed in accordance with the taste of the listener, the setting may be changed through an operating unit or the like which is not shown.

Returning to FIG. 2, an LPF 150 is a low-pass filter which outputs the audio signal Sb output from the harmonic generating section 140 while attenuating components of a frequency band that is equal to or higher than a preset cutoff frequency. The LPF 150 includes, for example, a 2nd-IIR filter. In the example, the cutoff frequency is 200 Hz, and the attenuation gradient is 12 dB/oct.

An HPF 160 is a high-pass filter which, with respect to the audio signal output from the LPF 150, attenuates components of a frequency band that is equal to or lower than a preset cutoff frequency. The HPF 160 includes, for example, a 2nd-IIR filter. In the example, the cutoff frequency is 80 Hz, and the attenuation gradient is 12 dB/oct.

An LPF 165 is a low-pass filter which outputs the audio signal output from the HPF 160 while attenuating components of a frequency band that is equal to or higher than a preset cutoff frequency. The LPF 165 includes, for example, a 2nd-IIR filter. In the example, the cutoff frequency is 200 Hz, and the attenuation gradient is 12 dB/oct. The cutoff frequency and the attenuation gradient may be changed so as to have another value. The disposition of the LPF 165, adjustments of its cutoff frequency and attenuation gradient, and the combination of the LPF with the LPF 150 enable the attenuation of the high-frequency side of the audio signal Sb to be made gentler or steeper. In the case of the audio signal Sin includes speech or the like, high-frequency components are excluded from the frequency band of the speech, so that the speech can be made easy to hear. The cutoff frequency and the attenuation gradient may be changed through an operating unit or the like which is not shown. Alternatively, the audio signal Sin may be analyzed to determine whether the signal includes speech or not, and they may be changed in accordance with the result of the determination. The LPF 165 is not always necessary, and the LPF 150 may play also the role of the LPF 165.

According to the configuration, the audio signal Sb output from the harmonic generating section 140 is filtered by the LPF 150, the LPF 160, and the LPF 165 to be formed as an audio signal (hereinafter, referred to as an audio signal Sc) in which components except for a partial frequency band is attenuated. The partial frequency band corresponds from 80 Hz to 200 Hz. Components except for the frequency band, or those which are equal to or lower than 80 Hz and equal to higher than 200 Hz are attenuated by the attenuation gradient of 12 dB/oct. Alternatively, a band-pass filter may be used in place of the LPF 150 and the HPF 160.

Although, in the example, the cutoff frequencies which are set in the LPF 150 and the HPF 160 are identical with those which are set in the LPF 120 and the HPF 130, they may be different from each other. The cutoff frequencies have only to be set so that a part of the harmonic components added in the harmonic generating section 140, and at least a part of the components of the audio signal Sa remain in the components of the audio signal Sc. Namely, the cutoff frequencies of the LPFs 120, 150 and the HPFs 130, 160 are requested to be set so that a part of the frequency band of harmonics added in the harmonic generating section 140, and at least a part of the frequency band of the audio signal Sa are included in the frequency band of the audio signal Sc.

In this case, when the frequency band of the audio signal Sc where only harmonics exists is attenuated in such a manner that the frequency band of the audio signal Sc is included in that of the audio signal Sa, a sense of strangeness of sounds which are emitted can be further reduced as described later.

A dynamic range compressing section (DRC) 170 receives the audio signal Sc, and outputs an audio signal Sd in which the dynamic range is compressed. Hereinafter, an example of the configuration of the dynamic range compressing section 170 will be described with reference to FIG. 5.

Figure 5:
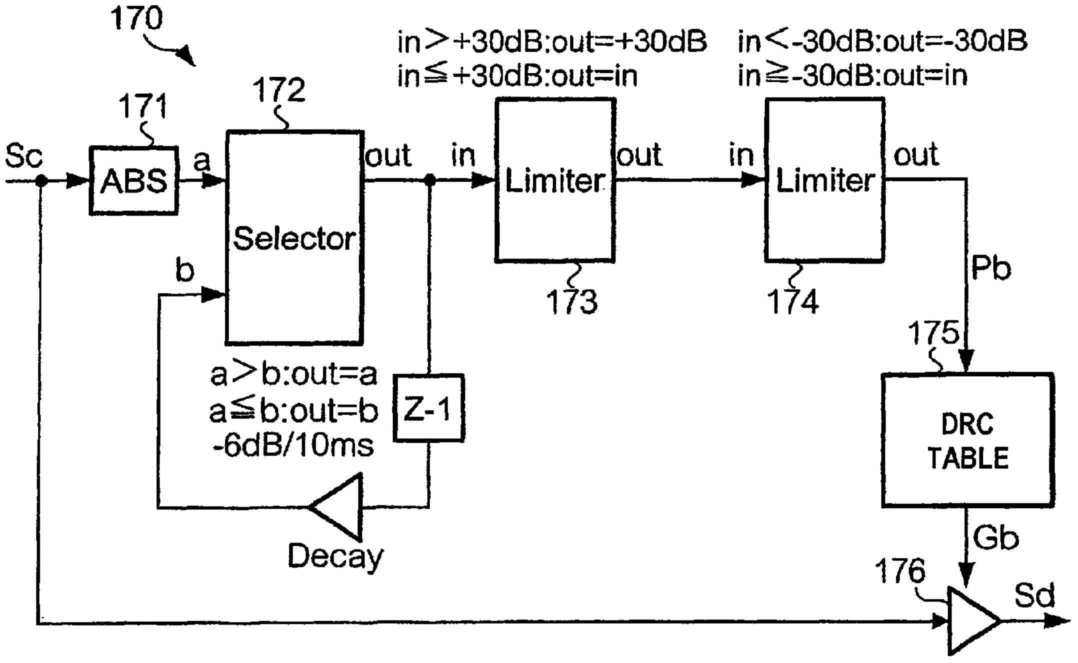
FIG. 5 is a block diagram showing the configuration of a dynamic range compressing section in the embodiment of the invention.

FIG. 5 is a block diagram showing the configuration of the dynamic range compressing section 170. The dynamic range compressing section 170 has an absolute value calculating unit (ABS) 171, a selector (Selector) 172, limiters (Limiters) 173, 174, a DRC table 175, and a level adjusting section 176. The absolute value calculating unit 171 and the selector 172 are configured in the same manner as the absolute value calculating unit 1411 and selector 1412 in the harmonic generating section 140, respectively, and hence their description is omitted.

The limiters 173, 174 set the upper and lower limits of the signal output level corresponding to the sound volume level of the audio signal Sc output from the selector 172. In the example, the upper limit of the signal output level is set to +30 dB, and the lower limit to −30 dB. The signal in which the upper and lower limits are restricted in this way is called the signal Pb. The limiters 173, 174 may be omitted.

Figure 6:
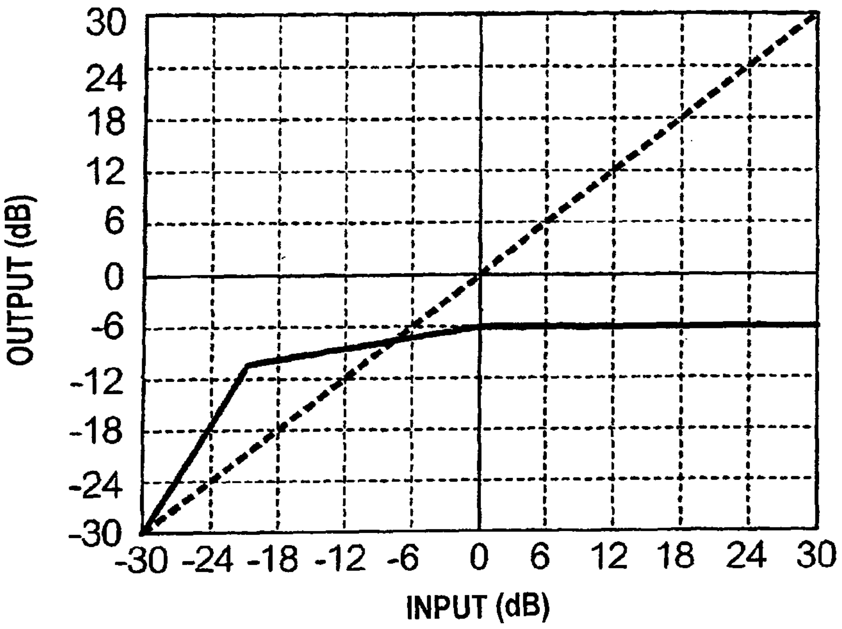
FIG. 6 is a view illustrating a DRC table in the dynamic range compressing section in the embodiment of the invention.

FIG. 6 illustrates the DRC table. The DRC table 175 is a table which is as shown in FIG. 6, and in which the level of the signal Pb is set as the input side, and an instruction value Gb that is required for obtaining the corresponding level is output to the output side. A broken line in FIG. 6 indicates the relationship between the input side and the output side when no level adjust is to be made; whereas a solid line in FIG. 6 indicates the relationship between the input side and the output side when level adjust is to be made. When the level of the signal Pb is "12 dB", for example, the level of the output side is "−6 dB", and hence the instruction value Gb is output as "−18 dB (=−6 dB−12 dB)". The DRC table shown in FIG. 6 is a table in which, in the case where the level of the input side is low, the low-frequency components are small, and hence the level to be output is increased (the instruction value Gb is increased), and, in the case where the level of the input side is high, the low-frequency components are excess, and hence the level to be output is reduced (the instruction value Gb is reduced). Even in the case where the level of the input side is low, when the level is lower than a preset level (in this example, "−21 dB"), the instruction value Gb is further reduced as the input level is lower. For example, the instruction value Gb in the case where the level of the signal Pb is "−24 dB" is smaller than that in the case where the level of the signal Pb is "−18 dB".

The DRC table is set in this way for the following reasons. When the level of the input side is "−8 dB" or higher, the low-frequency components are excess, and hence the level to be output is reduced. When the level of the input side is in the range from "−8 dB" to "−21 dB", the level of the low-frequency components is low, and therefore the level to be output is increased to emphasize the low-frequency components. By contrast, when the level of the input side is "−21 dB" or lower, the influence of the low-frequency component (sounds that are not bass sounds produced by a musical instrument, but are sounds such as ambient sounds) which are not important in the original source (the audio signal Sin) seems to be large, and therefore the level is adjusted so as not to be overemphasized. Although the DRC table is set as described above, the setting manner is an example, and the setting contents may be changed in accordance with the usage situation.

The level adjusting section 176 adjusts the level of the audio signal Sc in accordance with the instruction value Gb output from the DRC table 175, and then outputs the adjusted signal as the audio signal Sd. As described above, when the level of the audio signal Sc is "12 dB", the signal Pb is approximately "12 dB". In accordance with this, therefore, the level adjustment of the instruction value Gb of "−18 dB" is performed, so that the level of the audio signal Sd becomes "−6 dB" and follows the DRC table shown in FIG. 6. When the level of the audio signal Sc is "−30 dB" or less, the signal Pb is fixed to "−30 dB", and therefore the instruction value Gb is "0 db", so that the level of the audio signal Sd is equal to that of the audio signal Sc. When the level of the audio signal Sc is "30 dB" or more, the signal Pb is fixed to "30 dB", and therefore the instruction value Gb is "−36 db", so that the level of the audio signal Sd is adjusted by "−36 db" from that of the audio signal Sc.

Returning to FIG. 2, an adder 180 adds the audio signal Sd output from the dynamic range compressing section 170, to the channels of the input audio signal Sin. Channels on which the addition is performed may be preset channels. When the addition is performed, the gain may be adjusted for each of the channels. The signal processing unit 10 is configured as described above.

Figure 7A:
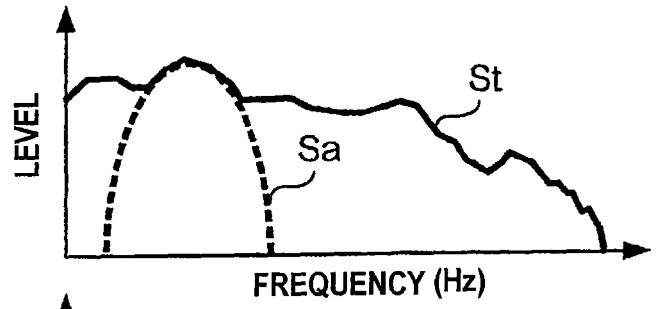
FIGS. 7A to 7C illustrate the frequency distribution of an audio signal which is processed in the signal processing unit in the embodiment of the invention.
Figure 7B:
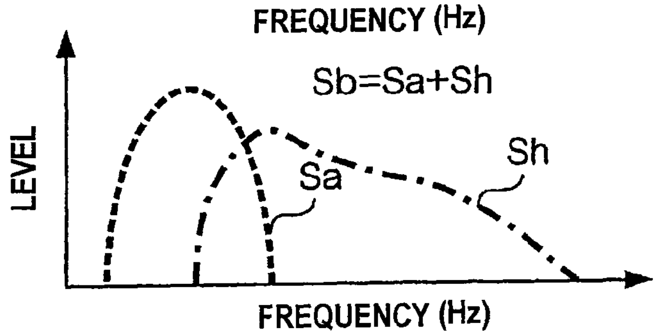
Figure 7C:
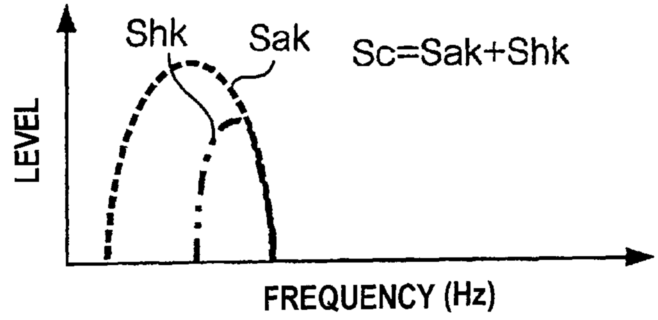

Next, changes of the frequency distribution of the audio signal in the processes of the signal processing unit 10 will be described with reference to FIGS. 7A to 7C. FIGS. 7A to 7C illustrate changes of the frequency distribution of the audio signal in the processes of the signal processing unit 10. As indicated by a broken line of FIG. 7A, the audio signal Sa output from the HPF 130 is a signal in which, in the audio signal St, frequency components except for those of a preset frequency band are attenuated.

Then, harmonics Sh are generated by the harmonic generating section 140 as indicated by a dash-dot line in FIG. 7B. Therefore, the audio signal Sb output from the harmonic generating section 140 is a signal in which the harmonics Sh are added to the audio signal Sa. As described above, the harmonics Sh are generated at a constant rate by changing the level at which the clipping is performed, in accordance with the sound volume level. When the frequency distribution of the audio signal Sa is identical, therefore, the component ratio of the audio signal Sa to the harmonics Sh is approximately constant irrespective of the sound volume level.

When the audio signal Sb is then processed by the LPF 150, the HPF 160, and the LPF 165, frequency components except for those of the preset frequency band are attenuated, so that, as shown in FIG. 7C, the components of the audio signal Sa are as indicated by Sak (broken line), and those of the harmonics Sh are as indicated by Shk (dash-dot-dot line). In the example, the attenuated components are identical with those before the harmonics are generated, and hence Sak is not substantially different from the audio signal Sa. The audio signal Sc is a signal which is obtained by combining Sak and Shk.

In the dynamic range compressing section 170, the dynamic range of the audio signal Sc is compressed. At this time, the level is adjusted while the component ratio of Sak and Shk is maintained. Therefore, a sense of strangeness in expansion of bass sounds in the case where sounds are emitted from the sound emitting section 20 can be reduced. The compression of the dynamic range can prevent the low-frequency component from being excessively expanded to change the sound quality, and the output in the sound emission from being clipped, and eliminate the sense of insufficiency of the sound volume even when the sound volume is low, so that a certain degree of low-frequency component expansion effect is attained.

In the speaker apparatus 1 of the embodiment of the invention, the input audio signals of the channels are acquired, and, after frequency components except for the low-frequency band are attenuated, the harmonics are added, and frequency components except for the low-frequency band are further attenuated. The attenuated audio signals are dynamic range compressed, then added to the input audio signals, and the resulting audio signals are emitted. At this time, the component ratio of the component of the audio signal of the harmonic generating origin to that of harmonics is not changed by the sound volume level, and the dynamic range is compressed while maintaining the component ratio. Therefore, the low-frequency component is expanded, and a sense of strangeness of sounds which are listened is reduced.

Although the embodiment of the invention has been described in the above, the invention may be practiced in various manners as described below.

<Modification 1>

In the above-described embodiment, the cutoff frequencies of the LPFs 120, 150 are set to 200 Hz, and those of the HPFs 130, 160 are set to 80 Hz. The setting values are not restricted to these. For example, the lower limit of the frequency band of the audio signal Sd which is added in the adder 180 may be set so as to depend on the characteristics of the speaker in the sound emitting section 20, and the cutoff frequency of the HPF 160 may be set for example so as to be equal to or higher than the minimum resonance frequency of the speaker. At this time, the cutoff frequency may be set as the minimum resonance frequency of the speaker, or, in consideration of the attenuation gradient, the setting may be performed so that a frequency which is equal to or lower than a constant level is set as the lower limit of the frequency band.

In another mode, in order to eliminate the influence of a human voice, the cutoff frequency of the LPF 120 may be set so that the upper limit of the frequency band of the audio signal Sa is 300 Hz or lower. Also in these settings, the cutoff frequencies of the LPFs 120, 150, 165 and the HPFs 130, 160 may be set in the following manner. The frequency bands of the audio signals Sa, Sc may be determined so that, as described in the embodiment, a part of the frequency band of the harmonics added in the harmonic generating section 140, and at least a part of the frequency band of the audio signal Sa are included in the frequency band of the audio signal Sc, and while adding various conditions. Under the above restrictions, the settings may be changed through an operating unit or the like which is not shown.

<Modification 2>

In the above-described embodiment, the signal processing unit 10 adds together the audio signals of the channels which are acquired in the acquiring section 110. Alternatively, the process of the signal processing unit 10 may be performed for each of the channels. In the alternative, the parameters which are set in the portions may be set differently for each of the channels.

The modification may be combined with Modification 1. In the case where the sound emitting section 20 has speakers having different characteristics, for example, the cutoff frequency of the HPF 160 may be set for each of the channels in accordance with the minimum resonance frequencies of the speakers to which audio signals of the channels are supplied.

<Modification 3>

In the above-described embodiment, in the case where the length of the process time from the acquiring of the audio signal of each channel in the acquiring section 110 to the addition to the audio signal of the channel in the adder 180 causes a time lag between the audio signal of the addition destination to that of the addition source, so that the listener feels a sense of strangeness, a delaying section which corrects the time lag corresponding the process time may be disposed between the acquiring of the audio signal in the acquiring section 110 and the addition in the adder 180 in the path of the audio signal of the cannel extending from "in" to "out".

<Modification 4>

The embodiment in which the components are configured by hardware has been described. Alternatively, the configuration may be realized by executing control programs stored in a storage unit or the like by a CPU of a computer which is not shown. Such control programs may be provided in a state where the programs are stored in a computer readable storage medium such as a magnetic storage medium (a magnetic tape, a magnetic disk, or the like), an optical storage medium (an optical disk or the like), a magnetooptical storage medium, or a semiconductor memory. In this case, a reading unit which reads the storage medium is disposed. The control programs may be downloaded via a network such as the Internet.

What is claimed is:

1. An audio signal processing apparatus comprising:

an acquiring unit which acquires an input audio signal;

a first filtering unit which outputs the audio signal acquired by the acquiring unit while attenuating frequency components of the audio signal except for frequency components of a first preset frequency band;

a detecting unit which detects a sound volume level of the audio signal output from the first filtering unit;

an amplitude limiting unit which calculates, as an amplitude limiting level, a constant ratio of the sound volume level detected by the detecting unit, and which limits an amplitude of a waveform of the audio signal output from the first filtering unit, wherein the amplitude to be limited is clipped at a level equal to or higher than the amplitude limiting level, thereby outputting an audio signal to which harmonics are added;

a second filtering unit which outputs the audio signal output from the amplitude limiting unit while attenuating frequency components of the audio signal except for frequency components of a second preset frequency band including at least a part of the frequency band of the audio signal output from the first filtering unit, and a part of the frequency band of the harmonics;

a compressing unit which outputs the audio signal output from the second filtering unit while compressing a dynamic range of the audio signal; and an adding unit which adds the audio signal output from the compressing unit to the input audio signal, and which outputs a result of the addition.

2. The audio signal processing apparatus according to claim 1, wherein the first preset frequency band in the first filtering unit includes the second preset frequency band in the second filtering unit.

3. The audio signal processing apparatus according to claim 2, wherein the first preset frequency band is the same as the second preset frequency band.

4. The audio signal processing apparatus according to claim 3, wherein the first and second preset frequency bands correspond to a range of 80 to 200 Hz.

5. The audio signal processing apparatus according to claim 1, wherein the amplitude limiting level is set to a range of (75±10)% with respect to the sound volume level detected by the detecting unit.

6. A speaker apparatus comprising:

an audio signal processing apparatus defined in claim 1; and a speaker which emits the audio signal output from the adding unit, wherein a lower limit frequency of the second preset frequency band in the second filtering unit is equal to or higher than a minimum resonance frequency of the speaker.

7. The audio signal processing apparatus according to claim 1, wherein the compressing unit includes limiters that set upper and lower limit values for an output level when the dynamic range of the audio signal is compressed.

8. The audio signal processing apparatus according to claim 1, wherein the compressing unit includes a DRC table by which an output level of the audio signal is pre-determined with respect to an input level of the audio signal and refers to the DRC table when the dynamic range of the audio signal is compressed.

9. An audio signal processing apparatus comprising:

an acquiring unit which acquires a multi-channel audio signal and outputs an audio signal in which at least two channels of the multi-channel audio signal are added to each other;

a first filtering unit which outputs the audio signal output by the acquiring unit while attenuating frequency components of the audio signal except for frequency components of a first preset frequency band;

a detecting unit which detects a sound volume level of the audio signal output from the first filtering unit;

an amplitude limiting unit which calculates, as an amplitude limiting level, a constant ratio of the sound volume level detected by the detecting unit, and which limits an amplitude of a waveform of the audio signal output from the first filtering unit, wherein the amplitude to be limited is clipped at a level equal to or higher than the amplitude limiting level, thereby outputting an audio signal to which harmonics are added;

a second filtering unit which outputs the audio signal output from the amplitude limiting unit while attenuating frequency components of the audio signal except for frequency components of a second preset frequency band including at least a part of the frequency band of the audio signal output from the first filtering unit, and a part of the frequency band of the harmonics;

a compressing unit which outputs the audio signal output from the second filtering unit while compressing a dynamic range of the audio signal; and an adding unit which adds the audio signal output from the compressing unit to each channel of the multi-channel audio signal, and which outputs a result of the addition.

* * * * *